United States Patent
Eichelberger et al.

(10) Patent No.: US 6,426,545 B1
(45) Date of Patent: Jul. 30, 2002

(54) INTEGRATED CIRCUIT STRUCTURES AND METHODS EMPLOYING A LOW MODULUS HIGH ELONGATION PHOTODIELECTRIC

(75) Inventors: Charles W. Eichelberger, Wakefield; James E. Kohl, Reading, both of MA (US)

(73) Assignee: EPIC Technologies, Inc., Woburn, MA (US)

( * ) Notice: Subject to any disclaimer, the term of this patent is extended or adjusted under 35 U.S.C. 154(b) by 0 days.

(21) Appl. No.: 09/502,078

(22) Filed: Feb. 10, 2000

(51) Int. Cl.[7] .................. H01L 23/08; H01L 23/14; H01L 23/58; H01L 29/12
(52) U.S. Cl. .................. 257/633; 257/508; 257/701
(58) Field of Search .................. 257/678–733, 257/508, 633

(56) References Cited

U.S. PATENT DOCUMENTS

| | | | | |
|---|---|---|---|---|
| 4,149,310 A | * | 4/1979 | Nippert | 29/825 |
| 5,249,101 A | * | 9/1993 | Frey et al. | 361/717 |
| 5,841,193 A | | 11/1998 | Eichelberger et al. | 257/723 |
| 5,903,046 A | * | 5/1999 | Brooks et al. | 257/632 |

OTHER PUBLICATIONS

"EPIC CSP Assembly and Reliability Methods," James E. Kohl et al., orginally published in the Proccedings of CS198, Santa Clara, California, May 1998.

"Low Cost Chip Scale Packaging and Interconnect Technology," James E. Kohl, et al., orginally published in the Proceedings of the Surface Mount International Conference, San Jose, California, Sep. 1997.

* cited by examiner

Primary Examiner—Howard Weiss
Assistant Examiner—Marcos D. Pizarro-Crespo
(74) Attorney, Agent, or Firm—Kevin P. Radigan, Esq.; Heslin Rothenberg Farley & Mesiti P.C.

(57) ABSTRACT

Structures and methods are provided for absorbing stress between a first electrical structure and a second electrical structure connected together, wherein the first and second structures have different coefficients of thermal expansion. A dielectric material is disposed on at least one of the first and second electrical structures. This dielectric material is a low modulus material which has a high ultimate elongation property (LMHE dielectric). Preferably, the LMHE dielectric has a Young's modulus of less than 50,000 psi and an ultimate elongation property of at least 20 percent. The LMHE dielectric can be photo patternable to facilitate formation of via openings therein and a metal layer is formed above the LMHE dielectric which has conductors capable of expanding or contracting with the dielectric. Conductors of the metal layer disposed above the dielectric and connected to vias in the dielectric have a length significantly greater than the maximum displacement due to thermal expansion between the first and second electrical structures, e.g., a length which is at least five times the displacement.

17 Claims, 10 Drawing Sheets

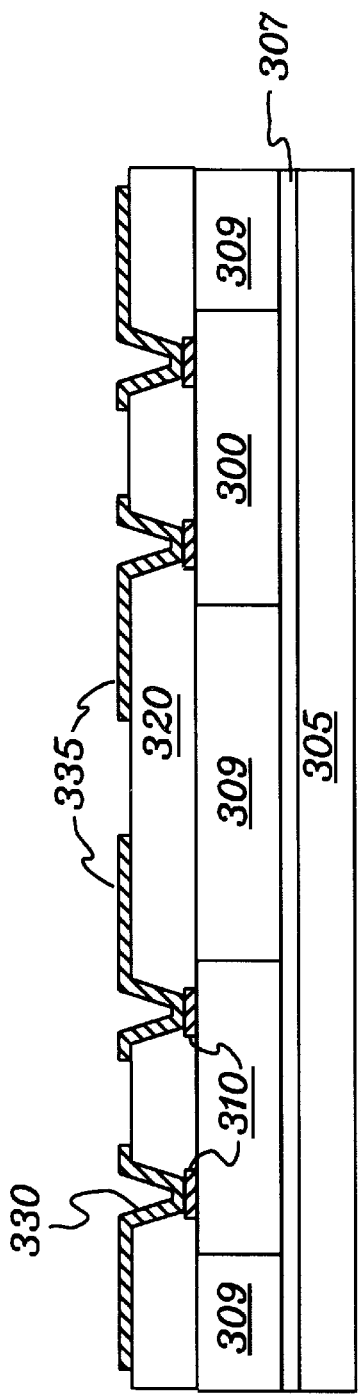
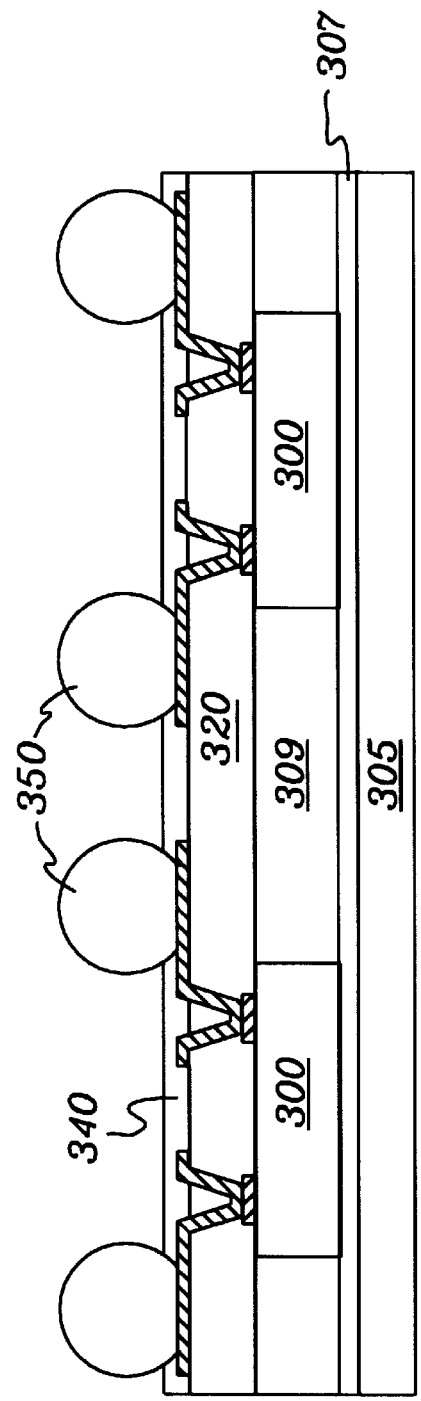
fig. 3C
fig. 3D

INTEGRATED CIRCUIT STRUCTURES AND METHODS EMPLOYING A LOW MODULUS HIGH ELONGATION PHOTODIELECTRIC

CROSS-REFERENCE TO RELATED APPLICATIONS

This application contains subject matter which is related to the subject matter of the following applications, each of which is assigned to the same assignee as this application and each of which is hereby incorporated herein by reference in its entirety:

"Electroless Metal Connection Structures and Methods," Eichelberger et al., Ser. No. 09/501,200, co-filed herewith;

"Structure and Method for Temporarily Holding Integrated Circuit Chips in Accurate Alignment," Ser. No. 09/501,176, co-filed herewith; and "Complaint, Solderable Input/Output Bump Structures," Ser. No. 09/501,177, co-filed herewith.

TECHNICAL FIELD

The present invention relates in general to packaging integrated circuits, and more particularly, to structures and methods for absorbing stress between a first electrical structure and a second electrical structure connected together, wherein the first and second structures have different coefficients of thermal expansion.

BACKGROUND OF THE INVENTION

Typical dielectric materials employed in electronic packaging, and printed circuit processes, have a Young's modulus in the range of 200,000 to 2,000,000 psi. When such materials are used with ball grid array (BGA) packages which have large solder balls, the resultant stresses on the solder ball interconnections are acceptable and large numbers of thermal cycles can be endured.

As the size of these packages being interconnected is reduced, for example, to the same or nearly the same size as the packaged integrated circuit chip itself, the size of the solder balls that are used must also be reduced. Also, certain structures use small solid metal bumps on packaging, and depend on solder stenciled on lands of, for example, the printed circuit board for connection. The use of small solid balls or solder bumps increases the strain that the solder interconnect and the balls or bumps must endure during thermal cycling. This increased strain leads to fatigue and premature failure of the connection. Solder has a characteristic where fatigue occurs in less than 100 cycles at a five percent strain, whereas more than one thousand cycles can be obtained before fatigue if the strain is maintained at or below one percent.

Thus, presented herein is a novel low modulus high elongation dielectric material which when employed in the structures and methods described below maintains the strain on the solder interconnect and interconnection bumps to a minimum desired level.

DISCLOSURE OF THE INVENTION

Typical electronic assemblies have been analyzed by stress/strain analysis. It has been found that for coatings in the 20–60 micron thickness-range a modulus below 20,000 psi allows the dielectric material to take up expected strain without exceeding levels of strain that would fatigue the interconnection bumps. This is true regardless of the thickness of the solder or solid interconnect. Further, if the dielectric material has a strain limit (i.e., ultimate-elongation property) of greater than twenty percent, then the dielectric material will not fail and a highly reliable system is obtained.

In addition to low modulus and high strain (elongation) capability, several other features of the material are also preferred for the material to be useful as a dielectric in electronic packages and in printed circuit additive layer applications.

First, it is desirable to pattern small via holes in the material, e.g., by photo patterning such that when the material is exposed to UV light through a mask and then developed, the desired via holes are formed. Ideally the via holes to be formed have a hole-wall profile that is slightly smaller at the base than at the top. This provides for easier metallization thereof. Many photo patternable materials are limited to a maximum thickness of under 20 microns. This is due to the natural absorption of the UV light by the material itself. Photo-patternable polyimide is one example. To take maximum advantage of the elongation of the material, however, it is believed preferable to process at a thickness the same or greater than the maximum displacement to be encountered. As an example, typical printed circuit board expansion is 20 ppm/degree C. The operational temperature-range is 100 C. and a maximum package size is 1 inch.

This gives a maximum displacement of $$100C*20E-06*1 \text{ inch}/2=0.001 \text{ inch}.$$

From this it can be seen that the thickness of the dielectric should be at least 1 mil (25 micron) and ideally the thickness should be greater than this value. A thickness range of 25 to 60 microns is believed to cover most requirements.

The adhesion properties of the material are also significant. It must adhere well throughout processing and through significant environmental stresses. The material must adhere to silicon and gallium arsenide of typical IC chips. Further, it must adhere to copper, printed circuit material and to itself for multi-layer circuits.

Additionally, processing temperatures required for the material should be less than 200 C because printed circuit boards will warp above this temperature. Where chips first structures are involved possible damage to sensitive IC chips can occur on prolonged exposure above 200 C. Finally, the material should be capable of accepting metallization. Specifically, in the printed circuit and low cost packaging industry the preferred method of metallization is electroless copper deposition, wherein the dielectric is adhesion promoted, catalyzed and then electroless copper deposited from commercially available electroless copper baths. For the dielectric to be useful it is desirable that the electroless copper have a peel strength in the 3 to 4 lb./inch range.

It should be noted that materials are available which have some but not all of the properties noted above for use as a low modulus high elongation packaging or additive printed circuit dielectric in accordance with the present invention.

In view of the above, one object of this invention is to provide a dielectric material that has a modulus below, e.g., 50,000 psi and a strain capability which exceeds twenty percent.

Another object of the invention is to provide a dielectric material which can be patterned to form small via holes (with diameters less than 2× thickness) using conventional photo exposure and development techniques in sections which are 20–60 microns thick.

A further object of the invention is to provide a dielectric material which when developed results in a hole-wall profile which is positive rather than negative.

Another object of the invention is to provide a dielectric material that can be coated with electroless copper using commercially available baths with adhesion peel strengths in excess of 3 lb./inch.

A still further object of the invention is to provide a material system that can be coated with sputtered metallization using titanium or chrome followed by copper metallization with good adhesion peel strengths and with ability to remove seed layers without damage to the material.

Still another object of the invention is to provide a material system which has good adhesion from the dielectric to silicon IC chips, copper, printed circuit board material, and lower layers of the same dielectric.

Yet another object of the invention is to be able to use the low modulus material disclosed herein to provide a metal/dielectric structure that will absorb differential expansion between two electrical structures, such as a printed circuit board and an associated IC in a module, such that the solder interconnect is not fatigued on thermal cycling.

Briefly summarized therefore, this invention comprises in one aspect a structure for absorbing stress between a first electrical structure and a second electrical structure. This structure includes a dielectric material disposed on at least one of the first electrical structure and the second electrical structure. The dielectric material is a low modulus material which has a high ultimate elongation property, such that the dielectric material comprises a low modulus high elongation (LMHE) dielectric which functions to absorb stress between the first and second electrical structures resulting from the first and second electrical structures having different coefficients of thermal expansion.

In another aspect, a method for absorbing stress between a first electrical structure and a second electrical structure is provided. The method includes: providing a dielectric material disposed over at least one of the first electrical structure and the second electrical structure; and wherein the providing of the dielectric material includes providing a low modulus material which has a high ultimate elongation property such that the dielectric material comprises a low modulus high elongation (LMHE) dielectric which functions to absorb stress between the first and second electrical structures resulting from the first and second electrical structures having different coefficients of thermal expansion.

In a further aspect, the invention comprises a method of connecting a first electrical structure and a second electrical structure. The method includes: providing a dielectric layer on at least one of the first electrical structure and the second electrical structure, wherein the dielectric layer is a low modulus material having a high ultimate elongation property, and wherein the low modulus high elongation (LMHE) dielectric functions to absorb stress resulting from the first electrical structure and the second electrical structure having different coefficients of thermal expansion; forming at least one via opening in the LMHE dielectric layer to expose at least one electrical contact of the at least one first electrical structure and second electrical structure having the LMHE dielectric layer; forming a metal layer over the LMHE dielectric layer and in the at least one via opening to electrically connect to the at least one electrical contact; and electrically connecting the first electrical structure and the second electrical structure using an electrical interconnect, the electrical interconnect being electrically coupled to the metal layer and therefore to the at least one electrical contact of the at least one first electrical structure or second electrical structure.

To restate, provided herein is a material system which has a low elastic modulus and high ultimate elongation property. The disclosed material is photo patternable and can be patterned with a very short exposure time. Further, the material can be developed in thick sections with excellent resolution using simple dip tank development techniques as opposed to more complicated spray development techniques. A structure having the low modulus high elongation (LMHE) dielectric disclosed herein can have via holes and be patterned with a metal to absorb any differential expansion between, for example, a printed circuit board and an attached chip scale package (CSP) or multi-chip module (MCM). The low modulus property essentially eliminates any stress on solder or other ball-type joints that interconnect, for example, packaged integrated circuit chips to a printed circuit board. The high elongation property allows the dielectric to stretch significantly without failure to the dielectric. Various structural configurations that make use of the LMHE dielectric material of the present invention are described herein.

BRIEF DESCRIPTION OF THE DRAWINGS

The above-described objects, advantages and features of the present invention, as well as others, will be more readily understood from the following detailed description of certain preferred embodiments of the invention, when considered in conjunction with the accompanying drawings in which.

Figure 2A:
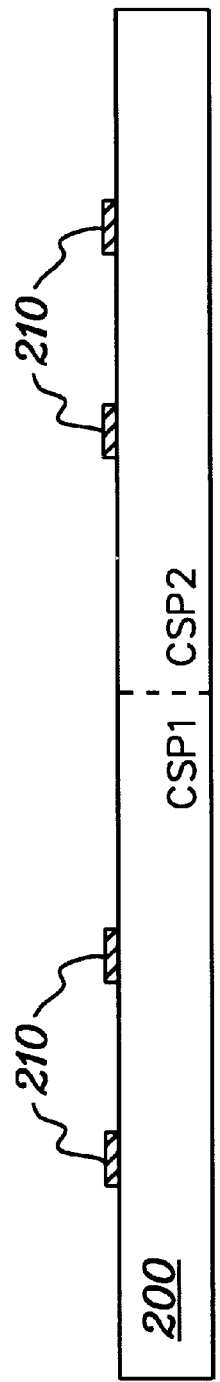
FIG. 2a is a cross-sectional elevational view of one embodiment of a wafer with two integrated circuit chips defined therein to employ a structure in accordance with the principles of the present invention.
Figure 2B:
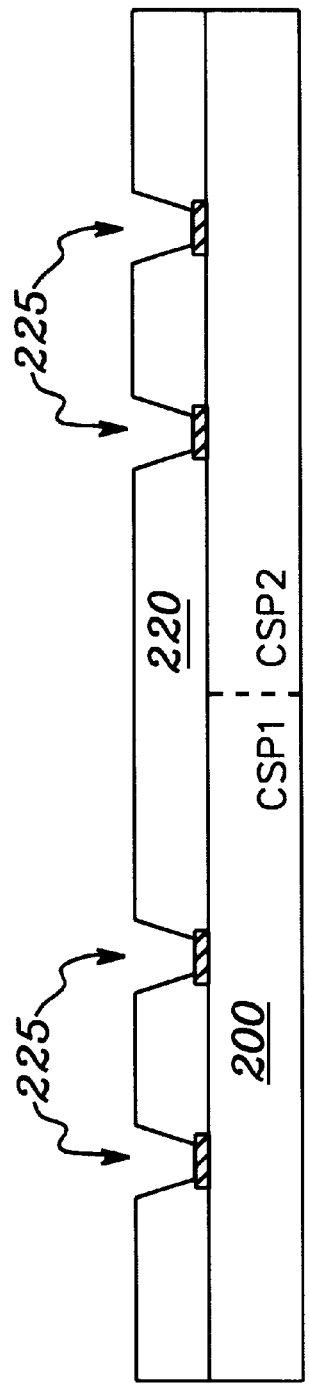
FIG. 2b is a cross-sectional elevational view of the structure of FIG. 2a with a low modulus high elongation dielectric layer disposed thereon and patterned with multiple via holes to the bond pads of the two integrated circuit chips in accordance with the principles of the present invention.
Figure 2C:
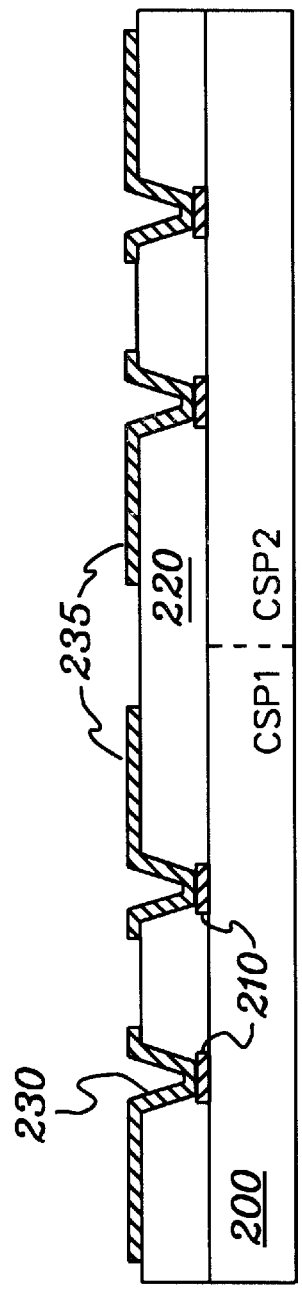
FIG. 2c is a cross-sectional elevational view of the structure of FIG. 2b after application and patterning of metallization in accordance with the principles of the present invention.
Figure 2D:
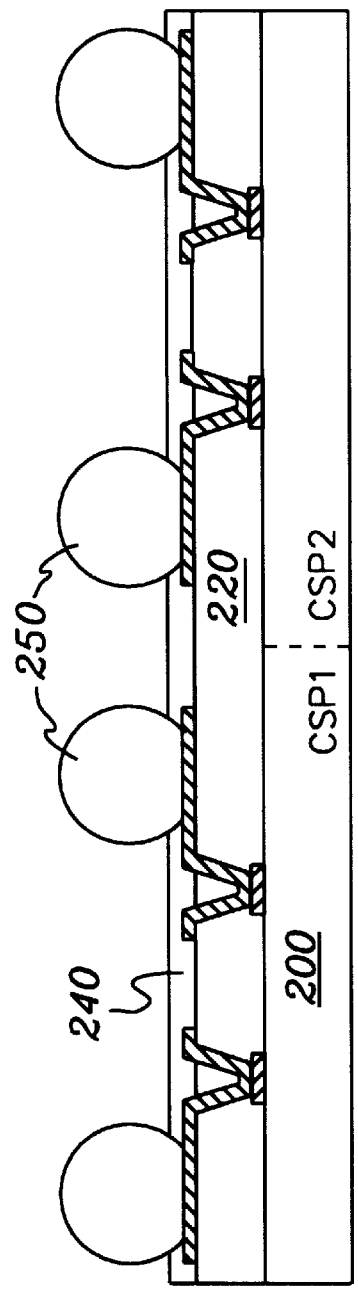
FIG. 2d is a cross-sectional elevational view of the structure of FIG. 2c after application of a solder mask and solder balls in accordance with the principles of the present invention.
Figure 2E:
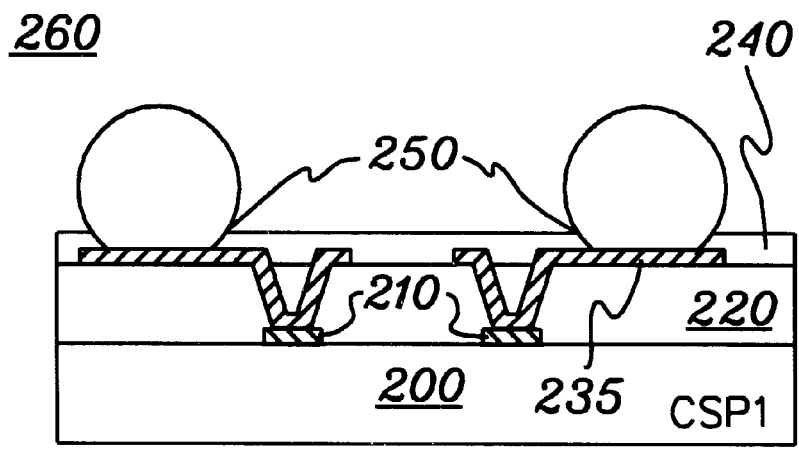
FIG. 2e is a cross-sectional elevational view of a portion of the structure of FIG. 2d after a chip scale package (CSP)
Figure 3A:
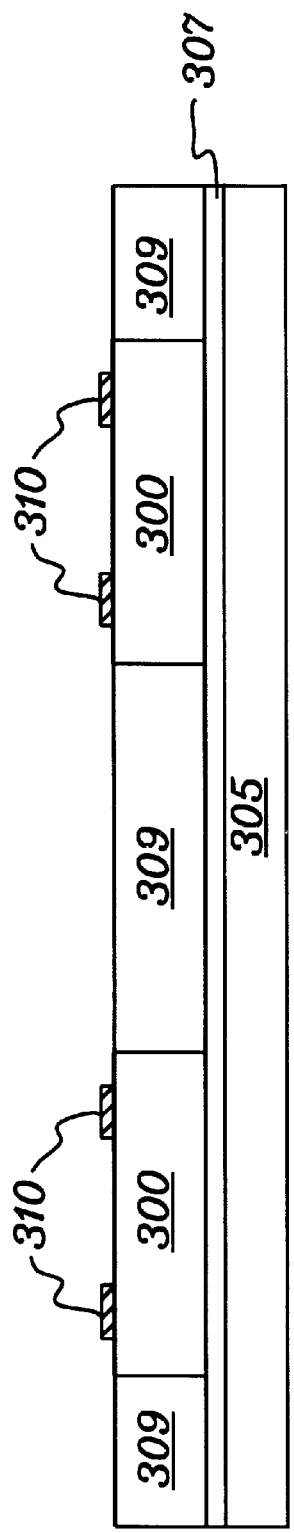
Figure 3B:
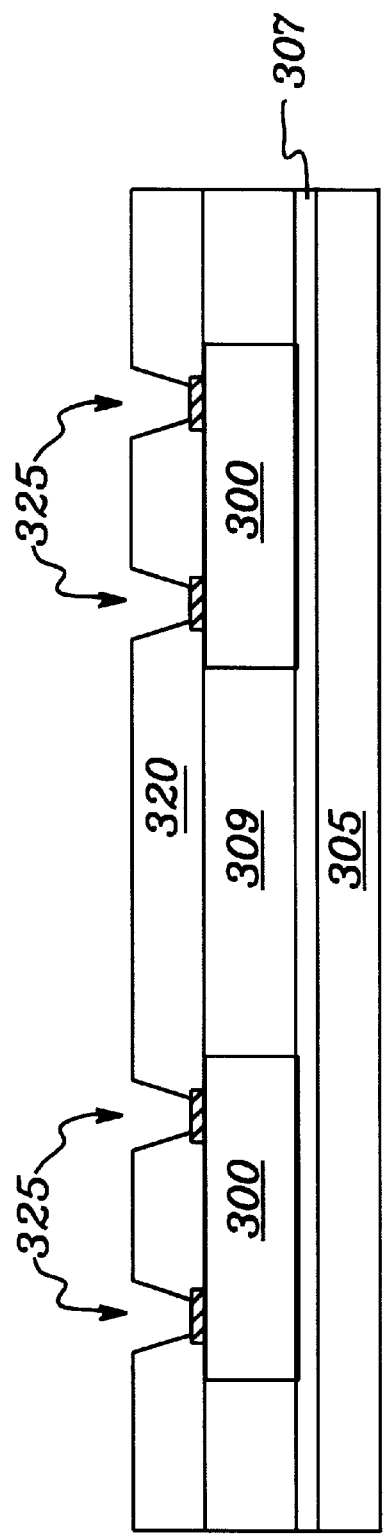
Figure 3E:
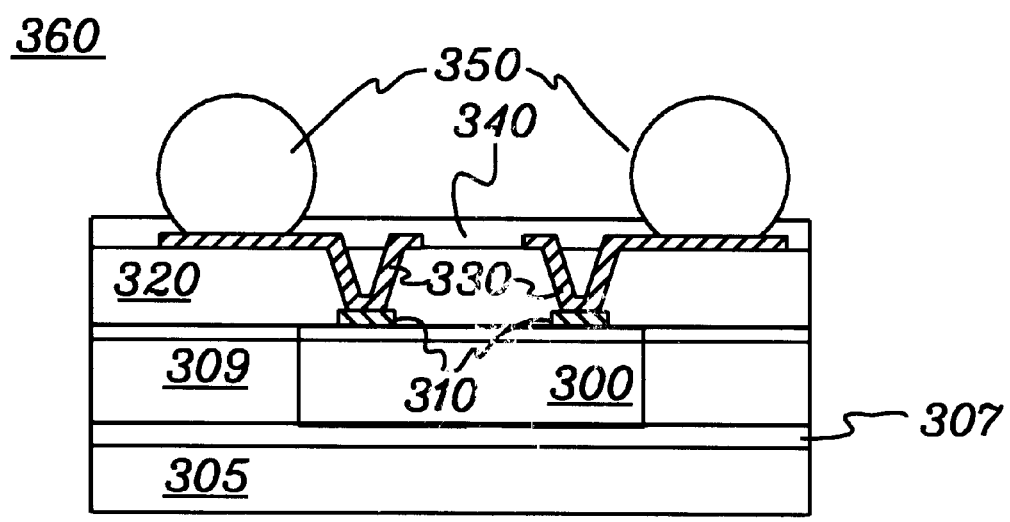
Figure 4:
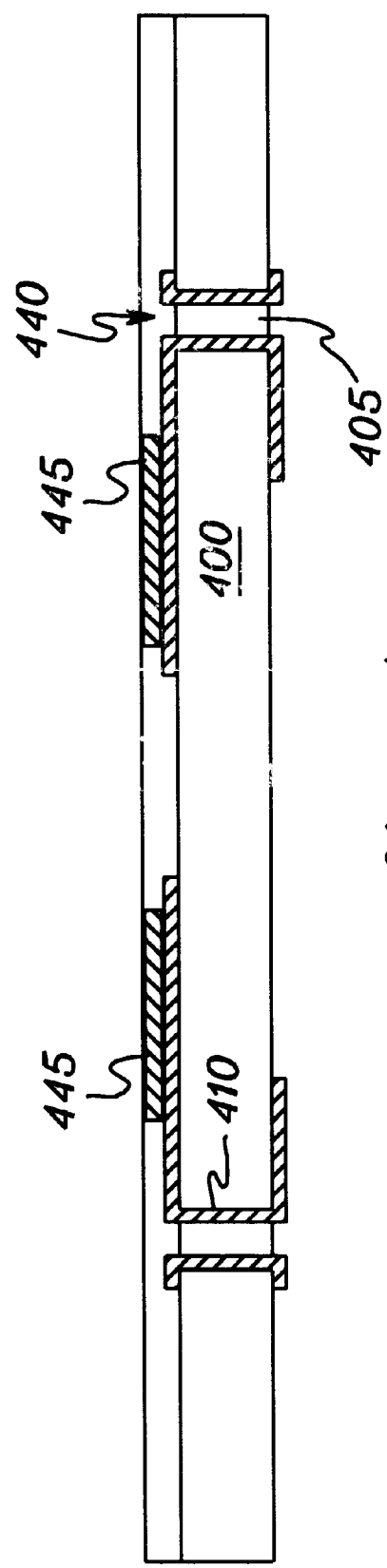
Figure 4A:
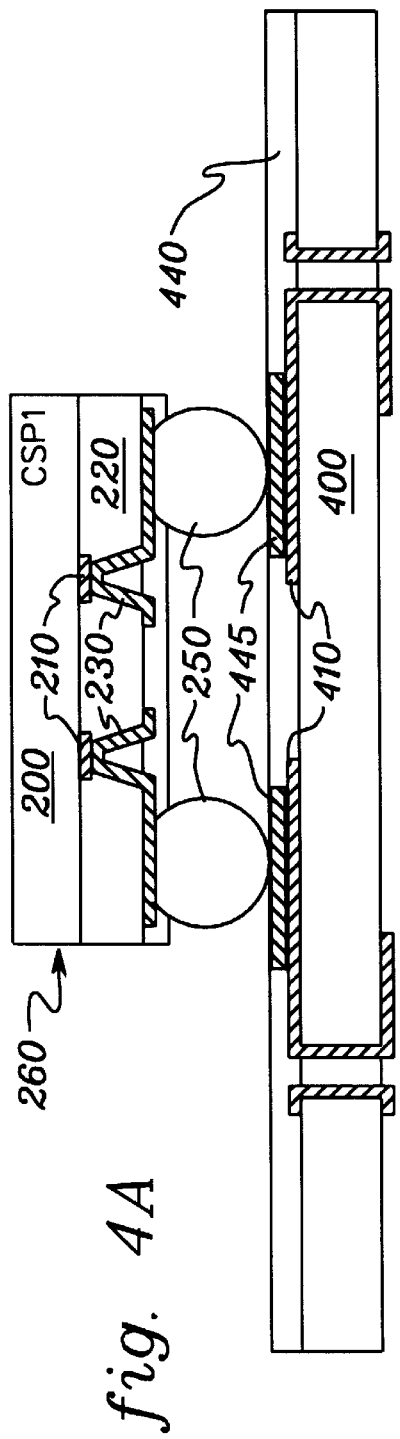
Figure 4B:
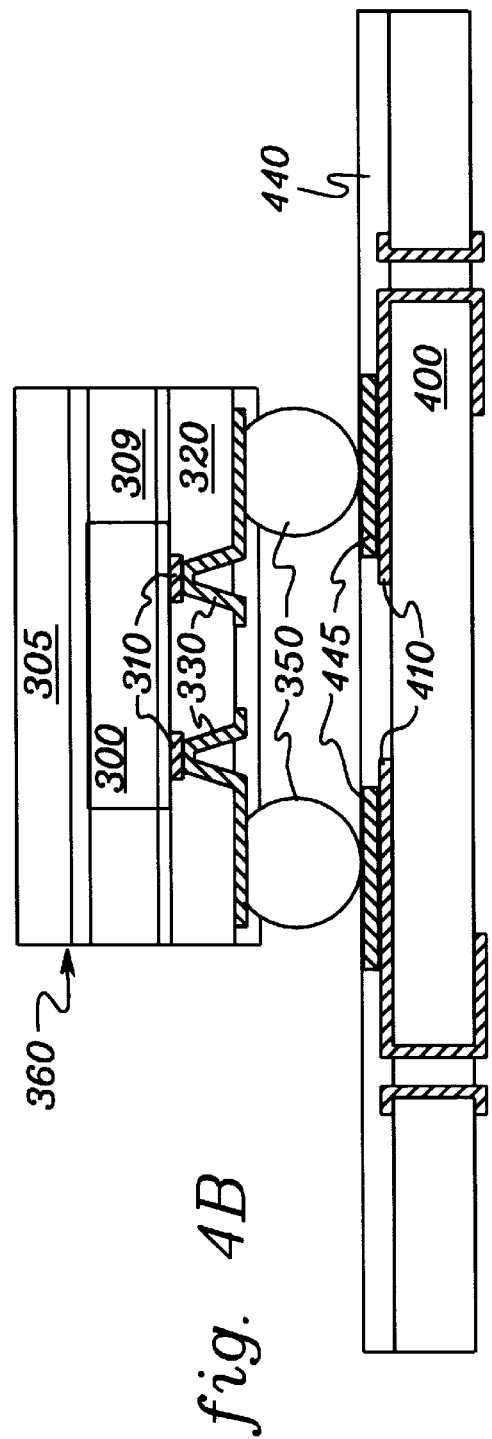

has been singulated from the wafer in accordance with the principles of the present invention;

FIG. 3a is a cross-sectional elevational view of one embodiment of a panel of singulated integrated circuit (IC) chips surrounded by filler mounted on a substrate to employ a structure in accordance with the principles of the present invention;

FIG. 3b is a cross-sectional elevational view of the structure of FIG. 3a after a low modulus high elongation (LMHE) dielectric has been added and patterned with via holes in accordance with the principles of the present invention;

FIG. 3c is a cross-sectional elevational view of the structure of FIG. 3b after application and patterning of a metal layer over the LMHE dielectric in accordance with the principles of the present invention;

FIG. 3d is a cross-sectional elevational view of the structure of FIG. 3c after a solder mask has been applied and solder bumps added in accordance with the principles of the present invention;

FIG. 3e is a partial cross-sectional elevational view of the structure of FIG. 3d after singulation of packaged integrated circuit chips in accordance with the principles of the present invention;

FIG. 4 is a cross-sectional elevational view of one embodiment of a printed circuit board with plated through holes and stenciled solder paste to employ a structure in accordance with the principles of the present invention;

FIG. 4a is a cross-sectional elevational view of the structure of FIG. 4 after connection to the circuit board of a bumped module of FIG. 2e in accordance with the principles of the present invention; and FIG. 4b is a cross-sectional elevational view of the structure of FIG. 4 after bumped connection of a singulated module of FIG. 3e thereto in accordance with the principles of the present invention.

BEST MODE FOR CARRYING OUT THE INVENTION

As noted briefly above, disclosed herein are various dielectric and metal structures that can absorb differential strain between a first electrical structure and a second electrical structure which are bump interconnected, such as between a printed circuit board and an associated packaged or bumped integrated circuit (IC) chip attached thereto with solder interconnect. In this context, "bump" interconnects include solder balls, solid metal bumps and any raised pad interconnect structures. In all embodiments, a low modulus high elongation (LMHE) dielectric material is presented to absorb strain due to expansion mismatch again between, for example, an FR4-type printed circuit board and a bumped IC chip module.

A preferred LMHE dielectric material, optimized for application by spray coating, is formulated by combining 600 grams of acrylated aromatic urethane oligomer with a functionality of 2.3 and a molecular weight of 1500 (EBE 6700™ UCB Chemicals, Smyrna, Ga.); 680 grams propylene glycol methyl ether acetate (Shipley, Marlborough, Mass.); 18 grams of 2-benzyl-2-dimethylamino-1-(4-morpholinophenyl)-1-butanone photo initiator (Irgacure 369™ Ciba-Geigy Corporation, Hawthorne, N.Y.); 12 grams methacryloxypropyl trimethoxysilane (Silar, Scotia, N.Y.) and 2.4 grams of fluoroaliphatic polyester wetting agent (FC430™ 3M Specialty Chemicals, St. Paul, Minn.). The combination is mixed thoroughly and filtered through a 1 micron absolute filter to remove any particulate. This material can then be sprayed to form coatings of thickness varying from 20 to 60 microns.

Figure 1A:
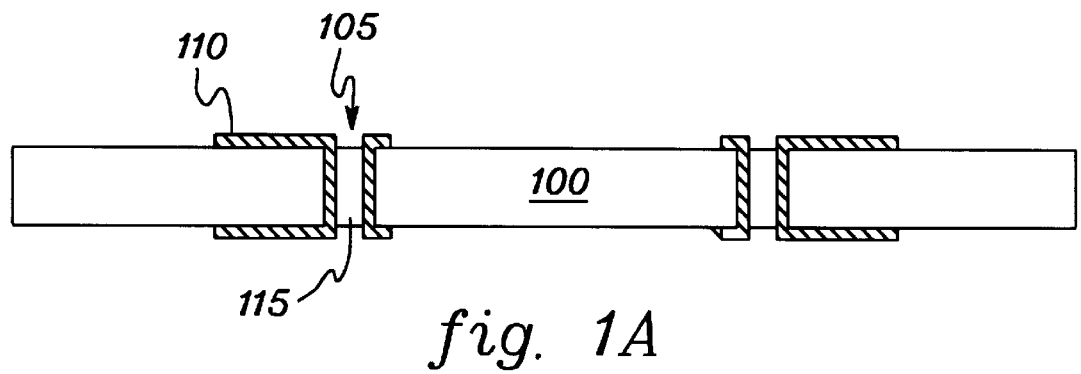
FIG. 1a is a cross-sectional elevational view of one embodiment of a printed circuit board with filled plated through holes to employ a structure in accordance with the principles of the present invention.

FIG. 1a shows a typical printed circuit board 100, such as a FR4 printed circuit board, with through holes 105 plated with two-sided metallization 110. The through holes 105 are filled 115 to prevent subsequently applied dielectric from flowing out through the holes. This can be done by tenting with solder mask or by squeegee application of a resin to fill the holes. The fabrication of such a circuit board is well known in the art. Boards of this type can be fabricated with large numbers of layers to provide any required interconnect and to provide power and ground planes. The so-called laminated printed circuit board with plated through holes is limited in circuit density by the size of the plated through hole and the minimum width of the printed circuit metallization. This has led to the introduction of a process where dielectric is applied to a circuit board, vias are formed in the dielectric to the top layer of the PC board and metallization is patterned on top of the dielectric. This process increases the wiring density capability due primarily to the reduction in size of the via hole versus the plated through hole. Additional improvement in density is afforded by the fact that the dielectric as applied is typically smoother than laminate and therefore finer lines can be patterned.

A low modulus high elongation (LMHE) dielectric 120 (FIG. 1b) in accordance with the principles of the present invention can be used directly over most substrates but the adhesion and environmental stress capability of the material can be improved by the use of a primer layer. A suitable primer is provided by a mixture of 120 gm of Master Bond EP42HT Part A, available from Master Bond of Hackensack, N.J.; 90 gm of RBC-710, available from RBC of Warwick, R.I.; 800 gm of propylene glycol methyl ether acetate available from Shipley of Newton, Mass.; and 6.6 gm of glycidoxypropyl trimethoxysilane available from Silar of Scotia, N.Y. The ingredients are thoroughly mixed. The primer can be spray coated to a thickness of 1 micron. The low modulus high elongation dielectric material (LMHE dielectric) disclosed can then be applied by spray coating. The coating is applied so that the thickness after baking is preferably 40–60 microns. Thicker coatings provide more displacement while thinner coatings allow smaller via holes to be formed. The board with the LMHE coating applied is soft baked in an oven at 95 C for a period of 30 minutes.

Via holes 125 are patterned in the dielectric 120 by exposing the dielectric through a glass mask on a Karl Suss MA150 mask aligner available from Karl Suss America, Inc. of Waterbury Center, Vt., operating at 25 mW/cm$^2$ at 365 nM with an exposure time of 1 second and an exposure distance, mask to dielectric, of 100 micron. It should be noted that this exposure time is significantly less than required by other dielectric systems. For example, an epoxy dielectric material 9500 CC-1 supplied by Shipley of Newton, Mass. requires 30 seconds to expose in the same 40 micron thickness. A polyimide photo patternable dielectric material Ultradel 7505 available from Amoco of Chicago, Ill., requires 30 to 60 seconds to expose in 40 micron thickness.

Figure 1B:
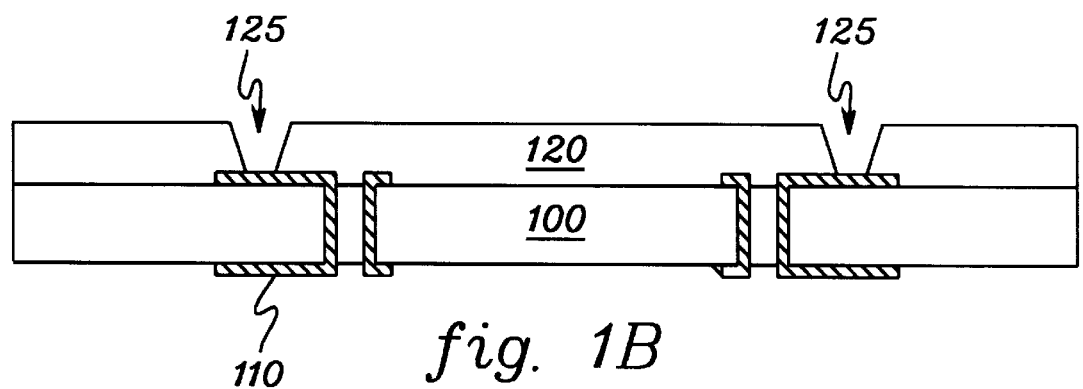
FIG. 1b is a cross-sectional elevational view of the structure of FIG. 1a with an LMHE dielectric layer disposed thereon and which has multiple via openings defined therein, in accordance with the principles of the present invention.

After exposure, the dielectric is developed by dip developing for 1:20 min in a one-part to two-part solution of propylene glycol methyl ether and propanol. After development, the board is rinsed in pure propanol for one minute and then dried. The resultant via holes for a 40 micron round mask feature are 35 micron at the top and 28 micron at the base. This is the desired positive slope. In addition, it should be noted that the resolution is far greater for this dielectric than any other known dielectric especially given the 100 micron exposure distance and the dip rather than spray development. Neither the 9500 CC-1 nor the 7505 can reliably resolve 40 micron via holes in 40 micron thick material. Again, FIG. 1b shows the FR4 circuit board 100 with the coated LMHE dielectric 120 with via holes 125 formed in the dielectric.

The dielectric is next plasma etched in a 30% $CF_4/O_2$ plasma to clean residue off the metal at the base of the via holes and to roughen the surface of the dielectric to improve adhesion. Before metallization the panel is dipped in an ammonium persulfate solution to remove oxide from the copper in the base of the via holes and to micro roughen that copper surface. At this point the material can be coated with electroless metallization or with sputter metallization.

Before application of electroless metallization, it is preferred to increase the texture of the dielectric to improve catalyst uptake and to improve the adhesion of the metal to the dielectric. One way to achieve this is by permanganate etching which is well known in the art. In a novel and presently preferred method, the surface of the dielectric is coated with a very fine powder and then plasma is used to etch the image of the powder into the dielectric. The powder is then removed, leaving a micro textured surface.

The details of this process are given below. 40 gm of Microgrit GB 3000 is added to 1 liter of propanol and mixed thoroughly at high sheer. Microgrit GB 3000 is available from Micro Abrasives of Westfield, Mass. A substrate is dipped in the mixture and withdrawn at a constant rate of 1 inch/min. This will coat a thin uniform coating of powder over the surface of the dielectric. The part is then placed in a 30% $CF_4/O_2$ plasma and etched for 10 min at 400W in an LFE 1000 barrel etcher. This etches the dielectric surface but the etching is masked by the powder. This essentially leaves an image of the powder which is a fine uniform texture. This process eliminates the prior art requirement of corrosive chemicals and also works well on materials which can not be easily textured in permanganate.

Electroless copper metallization is next applied, e.g., using an electroless copper system such as available from Lea Ronal of Freeport, N.Y. Catalyzation is achieved by a dip in a UMT catalyst pre dip solution operated at room temperature for 2 minutes. This is followed by a dip in the UMT catalyst solution operated at 32 C for a period of 10 minutes. Following UMT catalyst dip, parts are water sprayed to remove excess catalyst and then transferred immediately to the electroless plating solution.

Copper electroless plating is achieved by a dip in Ronadep 100 plating solution operated at 48 C for a period of 4 minutes. This is followed by a 1 minute DI water rinse and a dip in 20 percent citric acid solution operated at room temperature for a period of 1 minute. The parts are again DI rinsed for 1 minute and dried with clean dry high pressure air.

Figure 1C:
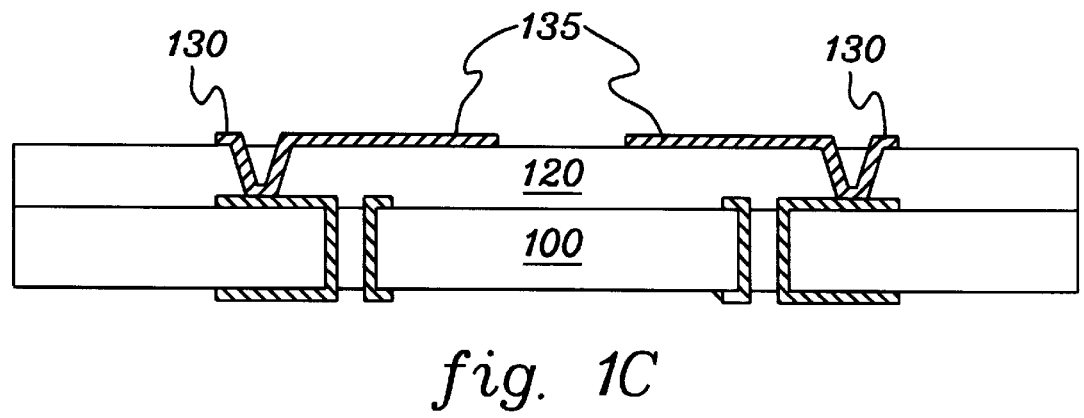
FIG. 1c is a cross-sectional elevational view of the structure of FIG. 1b after metallization has been applied and patterned over the LMHE dielectric layer to form interconnect to the printed circuit board metallization in accordance with the principles of the present invention.

In one embodiment, plate-up patterning is used. In this approach a photo resist is applied, exposed and developed. This results in resist remaining everywhere except the areas where the metal interconnect pattern is desired. At this point, the module is placed in a copper electroplating bath and copper is electroplated to a thickness of 10 microns. The resist is then removed by 25–30% $CF_4/O_2$ Plasma. The electroless copper seed metal is removed by a 30 second dip in ammonium persulfate. This is followed by a DI water rinse and clean dry high pressure air dry. FIG. 1c shows the printed circuit board 100 with the LMHE dielectric 120 with via holes and patterned metallization 130. Metallization patterned over the LMHE dielectric was peel tested with peel strengths exceeding 3 lbs./in. In addition, it is possible to resolve 12 micron lines and spaces in the metallization. This resolution is well beyond the capabilities now commercially available for printed circuit processing and is made possible primarily by the relatively smooth surface presented by the LMHE dielectric.

It should be noted that in one aspect this invention comprises specially configured metallization 130 which for each interconnect conductor 135 disposed above LMHE dielectric 120, the conductor 135 has a length L that is greater than the maximum relative displacement between the first and second electrical structures due to thermal expansion. Preferably, the length L of each conductor is at least 5 times the maximum anticipated displacement between the first and second electrical structures to facilitate stretching of the conductor with movement of the LMHE dielectric 120.

If a conventional high modulus dielectric were used instead of the LMHE dielectric, the dielectric would rigidly bind the conductor 135 to the circuit board 100. When displacement between the first and second electrical structures due to differential coefficients of thermal expansion occurred, the conductor 135 would move with the circuit board. There would be no requirement for the conductor 135 to stretch to absorb the displacement. Instead the bump and solder interconnect would be required to absorb the strain. As pointed out, this would unduly strain the solder interconnect and limit the reliability of the structure. In multilayer structures using the LMHE dielectric it is preferred that the total accumulated length of all conductors between the via hole to the circuit board and the pad or bump connecting to the second electrical structure be 5 times the maximum displacement between the first and second electrical structures due to thermal expansion.

As a further option, metal layer 130 could be formed by sputter metallization. Specifically, the dielectric can be sputter coated by using the following sputter process. First the dielectric is RF back sputtered at an energy density of 1.5W/sq. inch for 20 minutes. This conditions the polymer surface and also cleans oxide from the surface of the metal at the base of the via holes. Next, titanium is sputtered to a thickness of 100 Angstroms. The titanium is used to provide adhesion to the polymer. This is followed by sputtering copper to a thickness of 2000 Angstroms.

In the one embodiment plate-up patterning is used. In this approach a photo resist is applied, exposed and developed. This results in resist remaining everywhere except the areas where the metal interconnect pattern is desired. The module is placed in a copper electroplating bath and copper is electroplated to a thickness of 10 microns. The resist is removed by $CF_4/O_2$ Plasma. The sputtered copper seed metal is removed by a 1:00 minute dip in ammonium persulfate. This is followed by a DI water rinse. The titanium is removed by a 45 second dip in TFT etch diluted 10/1 with DI water. This is followed by a DI water rinse and clean dry high pressure air dry. Again, FIG. 1c shows the printed circuit board with the LMHE dielectric with via holes and patterned metallization. Metallization patterned over the LMHE dielectric using this approach was peel tested with peel strengths exceeding 6 lbs./in. In addition, it is again possible to resolve 12 micron lines and spaces in the metallization. This resolution is well beyond the capabilities now commercially available for printed circuit processing and is made possible primarily by the relatively smooth surface presented by the LMHE dielectric.

It should be noted that processes have been disclosed above wherein both electroless and sputter metallization can be used with the dielectric of the present invention to produce high performance interconnect. Metallization of many very low modulus dielectrics by either or both techniques has proven to be problematic. For example, silicone rubber has low modulus capability but no method for electroless metallization is known. Additionally, sputter metallization of highly flexibilized polymers is not possible because the flexibilizer out gasses to a high degree at sputtering vacuum levels.

Figure 1D:
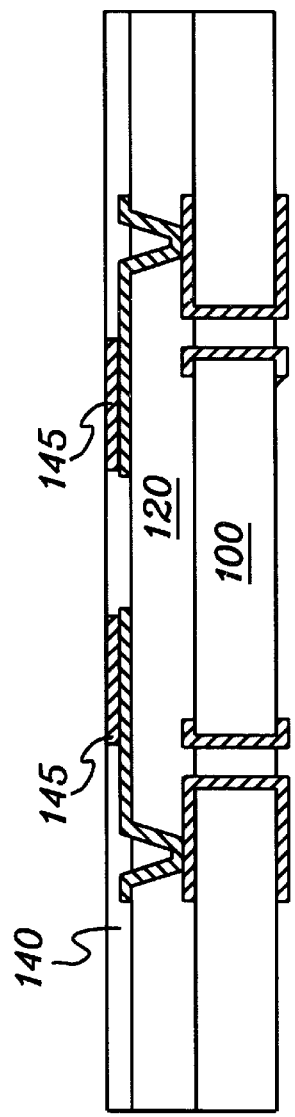
FIG. 1d is a cross-sectional elevational view of the structure of FIG. 1c after a patterned solder mask and stenciled solder paste have been provided in accordance with the principles of the present invention.
Figure 1E:
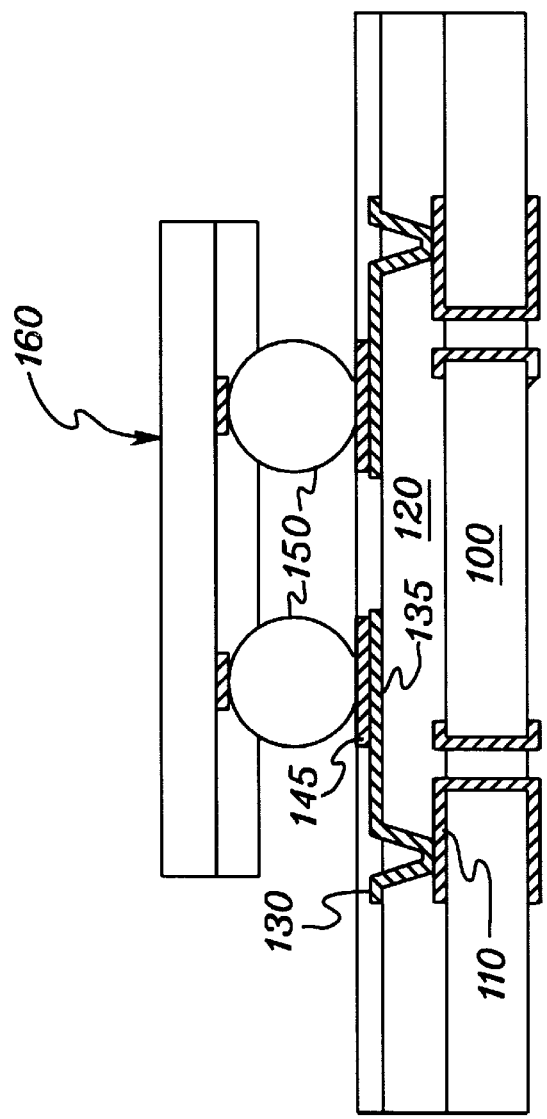
FIG. 1e is a cross-sectional elevational view of the structure of FIG. 1d showing bumped die attached to the circuit board.

At this point, one embodiment of the basic structure of the present invention has been completed. The description which follows shows how this structure and the LMHE dielectric material result in a metal/dielectric structure that will absorb the differential expansion between a printed circuit board and an associated IC in a module such that the solder interconnect is not fatigued on thermal cycling. In FIG. 1d, a solder mask 140 is patterned on the top surface of the dielectric. Solder paste 145 is stenciled in areas overlying the patterned metallization above the LMHE dielectric. FIG. 1e shows a bumped 150 die 160 soldered to the patterned metallization 130 above the LMHE dielectric.

Note that assuming the expansion coefficient of the silicon of the IC chip is 3 ppm/C and the expansion coefficient for the circuit board is 23 ppm/C, then for a 100 C differential and a 1 inch chip, the displacement would be Displacement=(23−3)ppm/C*100 C*1 in/2=0.001 inch.

As an approximation, a 4 mil solder bump must stretch to an amount given by the hypotenuse of a triangle formed by the 1 mil displacement and the 4 mil bump height. Material Stretch=Sqrt $(4^2+1^2)$=4.123. The strain on the 4 mil bump would be (4.123−4.0)/4.0 or 3%. This is in excess of the 1% strain limit for long solder fatigue life initially noted herein. For this reason, mounting large bumped IC chips directly on a printed circuit board has not been reliable. With the subject invention, however, a dielectric thickness of 60 micron (2.4 mil) thick yields good performance. As an approximation, the material must stretch to an amount given by the hypotenuse of a triangle formed by the 1 mil displacement and the 2.4 mil dielectric thickness. Material Stretch=Sqrt $(2.4^2+1^2)$=2.6. The elongation is then (2.6−2.4)/2.4=8.3%. This is much less than the 50% elongation capability of the material. In addition, since the modulus is only 2000 psi, the force on the bump is very low. As an approximation, if the area of the bump and the section of dielectric which is displaced is the same then the strain will be distributed as the ratio of moduli of the materials. This would be 8.3% *2000/(400,000+2,000)=0.04%. This value is much lower than the 1% strain limit for long solder fatigue life. Using representative available photo patternable dielectric materials, reliable strain levels would be exceeded. The modulus for the 9500 epoxy dielectric, type 9500-cc-1 as given in its specification sheet, is 300,000 psi and for the polyimide dielectric type 7505, as given in its specification sheet, is 1,000,000 psi. In the above example, the strain on the solder would be at least 8.3%*300,000/(400,000+300,000) or 3.6%. As further indication of the novelty of the disclosed invention, note that the maximum elongation of the 9500 (as given in its specification sheet) is 6 percent which exceeds the 8.3% requirement. Further this and most other dielectric materials have high glass transition temperatures which means that their maximum elongation at 0 C is far lower than their room temperature value. That is, they become brittle around 0 C which is a temperature required by circuit board-package assemblies. Polyimide systems are available with sufficient elongation but at a price of very high modulus so that high stress is necessarily transmitted to the associated solder interconnect and bumps. While these approximations are only rough approximations representative finite element analysis and actual experimental results support the value and novelty of the LMHE of the present invention.

Thus far, the concepts of the present invention have been explained in the terms of a printed circuit board having an LMHE dielectric and metallization configured to absorb any differential expansion between the printed circuit board and associated packaged IC chips bonded to the board. Several alternate configurations are also possible, making use of the same LMHE dielectric, via hole and patterned metal structure described above, to provide the same expansion absorption benefit. FIGS. 2a–2e depict use of the LMHE dielectric and metal layer on a chip scale package (CSP) process directly on an integrated circuit wafer, while FIGS. 3a–3e depict use of the LMHE dielectric and patterned metal structure in connection with individual chips formed into a panel. Note that fabrication of a "chips first" panel such as depicted in FIG. 3a is discussed in detail in commonly assigned U.S. Pat. No. 5,841,193 by Charles W. Eichelberger entitled "Single Chip Modules, Repairable Chip Modules, And Methods Of Fabrication Thereof," the entirety of which is hereby incorporated herein by reference.

FIG. 2a illustrates a cross-section of a wafer 200 having two integrated circuit chips, labeled CSP 1 and CSP 2. The IC chip pads 210 are shown at an upper surface of wafer 200. In FIG. 2b, the LMHE dielectric layer 220 has been coated and patterned with via openings 225 as described above. FIG. 2c depicts the wafer structure after metallization has been applied and patterned to form metal layer 230 having interconnect conductors 235, which are preferably sized as described above in connection with interconnect conductors 135 of FIGS. 1d & 1e.

In FIG. 2d, a solder mask 240 is patterned on the top surface of dielectric 220. Solder mask 240 could comprise the same low modulus high elongation dielectric material as layer 220. Solder flux is applied followed by solder balls 250 at each opening defined in mask 240. The solder balls are then reflowed by baking just above the melt point of the solder. Any excess flux is cleaned in a suitable solvent. The techniques for application of solder balls as described herein are well known in the art. Single modules are then formed by singulating the wafer, for example, with a diamond saw. This operation is also well known in the art. The result is a singulated CSP module 260 (FIG. 2e) having the LMHE dielectric 220 with via holes and patterned metal 230 with solder balls 250 attached. Module 260 can next be directly attached to a printed circuit board, such as an FR4 circuit board discussed above.

In FIG. 3a, a panel of individual integrated circuit chips 300 is shown. Again, details of the formation of such a panel are given in the above-incorporated U.S. Pat. No. 5,841,193. The panel includes a substrate 305 to which IC chips 300 are adhesively 307 bonded. Filler material 309 which has been applied, cured and lapped using the processes described in the incorporated patent surrounds the IC chips to obtain the structure shown. In the structure, bond pads 310 on the upper surfaces of chips 300 remain exposed. FIG. 3b depicts the panel of FIG. 3a after a LMHE dielectric 320 has been applied and patterned with via openings 325 as described above. FIG. 3c illustrates the panel of FIG. 3b after metallization and patterning of a metal layer 330. Again, metal layer 330 includes interconnect conductors 335 preferably having dimensions as described above in connection with conductors 135 of FIGS. 1d & 1e. Details of metallization application and patterning are provided above, and in the incorporated U.S. Pat. No. 5,841,193.

In FIG. 3d, a solder mask 340 is patterned on the top surface of LMHE dielectric 320. Solder flux is applied followed by solder balls 350 at each opening. The solder balls are then reflowed by baking slightly above the melting point of the solder. Any excess flux is then cleaned in a suitable solvent. The techniques for application of solder balls 350 are well known in the art. Note that solder mask 340 could comprise the same LMHE dielectric material as layer 320.

Single modules are then formed by singulating the panel with a diamond saw to produce single chip packaging 360 as depicted in FIG. 3e. Module 360 can then be applied directly to a circuit board, as described below in connection with FIGS. 4–4b.

FIG. 4 depicts a typical FR4 printed circuit board 400 with plated through holes 405 and two-sided metallization 410. A solder mask 440 has been applied and patterned, and stenciled solder paste 445 resides within the openings in solder mask 440. The fabrication of such a circuit board is well known in the art. FIGS. 4a & 4b show modules 260 (FIG. 2e) & 360 (FIG. 3e) described above attached directly to the circuit board of FIG. 4 by the reflowed solder paste and the solder bumps. As described above, the expansion coefficient of the IC material is in the 3–5 ppm/C range and the circuit board is in the 20–25 ppm/C range. In this configuration, the structure of LMHE dielectric with via holes and patterned metal provides the low modulus high elongation to absorb the thermal expansion mismatch. The low modulus of the LMHE dielectric prevents high stresses from being communicated to the solder joint and thereby significantly improves the reliability of the assembly during thermal cycling. The length of copper interconnect as well as its relative thickness and width also allows stretching of the interconnect without significant stress to the solder joint. Note again, it is desirable to have a length of interconnect which is many times the displacement between the two electrical structures.

Those skilled in the art will note from the above description that presented herein is a dielectric which has a low modulus, e.g., less than 50,000 psi (and preferably <20,000 psi), and a high ultimate elongation property, e.g., greater than 20%. The dielectric is photo patternable so that via openings can readily be formed therein, and metallization, preferably copper, is employed as interconnect to contact a conductor below the dielectric through the via holes and form a conductor of at least some nominal length on top of the dielectric. The resultant structure has the ability to make connection to associated circuitry below the dielectric (e.g., IC chips or a circuit board), yet provide a high elongation property to easily stretch to accommodate thermal expansion mismatch between a circuit board and an associated IC chip in a module. At the same time, the very low modulus characteristic puts little stress on the solder interconnection. The length of the interconnect and its width and thickness also allows stretching to accommodate any expansion mismatch, i.e., the relatively thin interconnect conductor and its fine width reduce any stress due to the force required to stretch the interconnect. Ideally, the length of each conductor above the LMHE dielectric should be many times the displacement due to thermal expansion between the first and second electrical structures at the point where the interconnect via pins the conductor to the first or second electrical structure. Also, note that this structure provides the same benefit whether placed on the circuit board or above the IC chips.

As used herein "low modulus" is a material with a modulus below 50,000 psi (the material described herein is 20,000 psi) and "high elongation" is a material with elongation at room temperature of greater than 20% (the present material is 50%). Note that many materials have high glass transition temperatures so that their elongation at 0 C or below is far less than their room temperature values.

Adding a low modulus high elongation dielectric and metallization above a circuit board as presented herein allows conventional flip chip or bumped die to be placed on an FR4 circuit board without the conventional requirement for under fill between the two electrical structures. This makes assembly completely compatible with conventional surface mount techniques. It also allows flip chips or bumped die to be removed and reworked if they are found to be defective.

Further, providing via holes in a low modulus layer should be distinguished from just placing a low modulus layer above a chip. Via holes allow interconnection to anywhere on the chip. They also allow a panel full of chips to be processed as opposed to processing only individual chips. Note that via holes are desired but they need not necessarily be formed by photo patterning. For example, a laser could form a via opening if desired. The significance of the LMHE material provided herein is that via openings can be formed therein.

While the invention has been described in detail herein in accordance with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A structure for absorbing stress between a first electrical structure and a second electrical structure, said structure comprising:

a dielectric material disposed on at least one of said first electrical structure and said second electrical structure; and wherein said dielectric material comprises a low modulus material which has a high ultimate elongation property, and wherein said dielectric comprises a low modulus high elongation (LMHE) dielectric which functions to absorb stress between said first and second electrical structures resulting from said first and second electrical structures having different coefficients of thermal expansion.

2. The structure of claim 1, wherein said LMHE dielectric has a Young's modulus of less than 50,000 psi.

3. The structure of claim 1, wherein said LMHE dielectric has an ultimate elongation property of at least twenty percent.

4. The structure of claim 1, wherein said LMHE dielectric comprises a photo patternable dielectric layer.

5. The structure of claim 4, wherein said photo patternable dielectric layer is at least 25 microns thick.

6. The structure of claim 1, further comprising at least one via opening in said LMHE dielectric, said at least one via opening exposing at least one electrical contact of said at least one first electrical structure or said second electrical structure having said LMHE dielectric layer disposed thereon.

7. The structure of claim 6, further comprising a metal layer over said LMHE dielectric and in said at least one via opening to electrically connect to said at least one electrical contact.

8. The structure of claim 7, wherein said metal layer comprises copper.

9. The structure of claim 7, further comprising an electrical interconnect electrically connecting said first electrical structure and said second electrical structure, said electrical interconnect being electrically coupled to said metal layer disposed over said LMHE dielectric layer to electrically connect to said electrical contact of said at least one first electrical structure or said second electrical structure.

10. The structure of claim 9, wherein LMHE dielectric layer has a Young's modulus less than a Young's modulus of said electrical interconnect connecting said first electrical structure and said second electrical structure.

11. The structure of claim 9, wherein said electrical interconnect comprises conductive bumps disposed between said first electrical structure and said second electrical structure.

12. The structure of claim 11, wherein said conductive bumps comprise at least one of solid bumps, raised pads or solder balls.

13. The structure of claim 7, wherein said metal layer comprises at least one conductor disposed above said LMHE dielectric layer, each conductor of said at least one conductor having a length L greater than a maximum displacement due to thermal expansion between said first and second electrical structures.

14. The structure of claim 13, wherein said length L of each conductor is at least five times said maximum displacement due to thermal expansion between said first and second electrical structures to facilitate stretching of said conductor.

15. The structure of claim 1, wherein said LMHE dielectric material has a Young's modulus of less than 20,000 psi, and wherein said LMHE dielectric material comprises a dielectric layer having a thickness in a range of 20–60 microns.

16. The structure of claim 15, wherein said LMHE dielectric material comprises an acrylated urethane material.

17. The structure of claim 1, wherein said first electrical structure and said second electrical structure each comprise one of a printed circuit board, a single chip module or a multichip module.

* * * * *